(12) United States Patent
Pang

(10) Patent No.: US 9,331,118 B2
(45) Date of Patent: May 3, 2016

(54) SENSOR AND METHOD FOR COLOR PHOTOSENSOR ARRAY WITH SHIELDED, DEEP-PENETRATION, PHOTODIODES FOR COLOR DETECTION

(71) Applicant: OmniVision Technologies, Inc., Santa Clara, CA (US)

(72) Inventor: Chin-Poh Pang, Pleasanton, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 22 days.

(21) Appl. No.: 14/028,127

(22) Filed: Sep. 16, 2013

(65) Prior Publication Data

US 2015/0076322 A1   Mar. 19, 2015

(51) Int. Cl.
*H01L 27/146* (2006.01)

(52) U.S. Cl.
CPC .... *H01L 27/14645* (2013.01); *H01L 27/14605* (2013.01); *H01L 27/14623* (2013.01); *H01L 27/14627* (2013.01)

(58) Field of Classification Search
CPC ....... H04N 5/357; H04N 5/225; H04N 9/077; H01L 31/0232; H01L 27/14625; H01L 27/14645; H01L 27/14623; H01L 27/14605
USPC .................. 250/208.1, 214 R, 239
See application file for complete search history.

(56) References Cited

U.S. PATENT DOCUMENTS 5,264,924 A * 11/1993 Cok ............................. 348/624
2014/0078349 A1* 3/2014 Velichko et al. ............. 348/241

* cited by examiner

Primary Examiner — Francis M Legasse, Jr.
Assistant Examiner — Don Williams
(74) Attorney, Agent, or Firm — Lathrop & Gage LLP

(57) ABSTRACT

A photosensor has a masking layer having an opening over a central photodiode and a first adjacent photodiode, the first adjacent photodiode covered by the masking layer and located sufficiently near the central photodiode that at least some light admitted through the opening over the central photodiode reaches the first adjacent photodiode through the central photodiode. The photosensor also has a second adjacent photodiode; the second adjacent photodiode covered by the masking layer and located sufficiently near the first adjacent photodiode that at least some light admitted through the opening over the central photodiode is capable of reaching the second adjacent photodiode through the first adjacent photodiode. Circuitry is provided for reading the photodiodes and generating a blue, a green, and a red channel signal by processing signals read from the photodiodes.

17 Claims, 6 Drawing Sheets

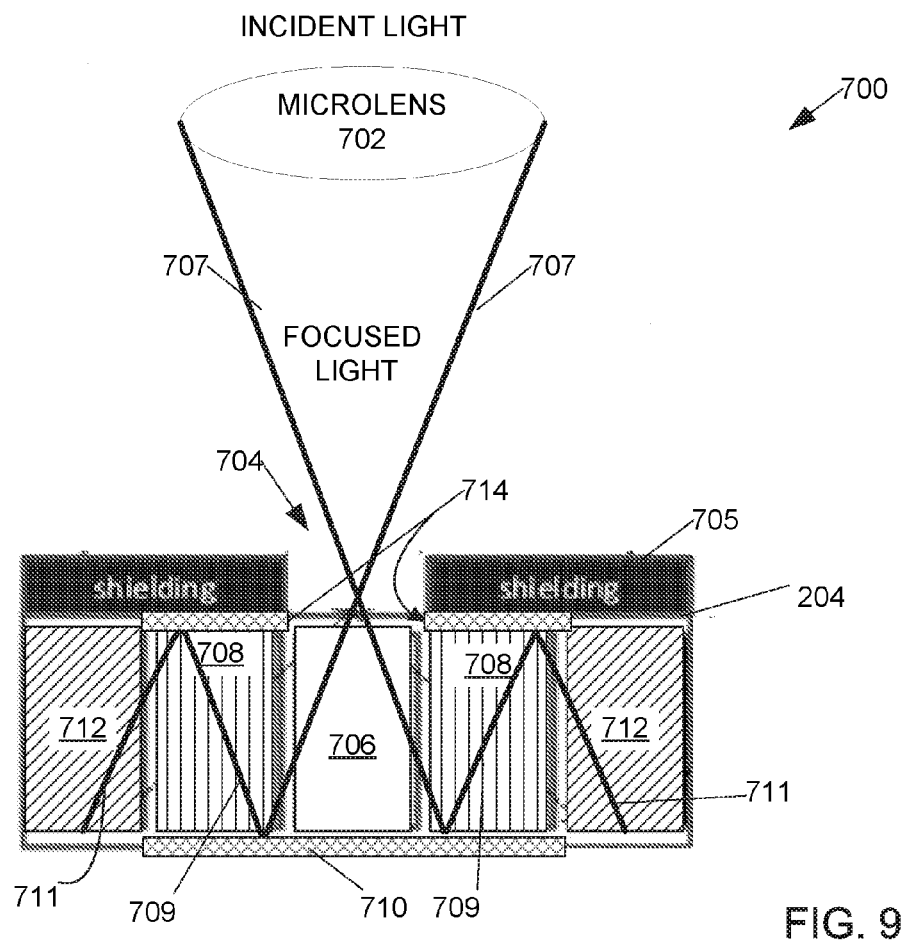
FIG. 9
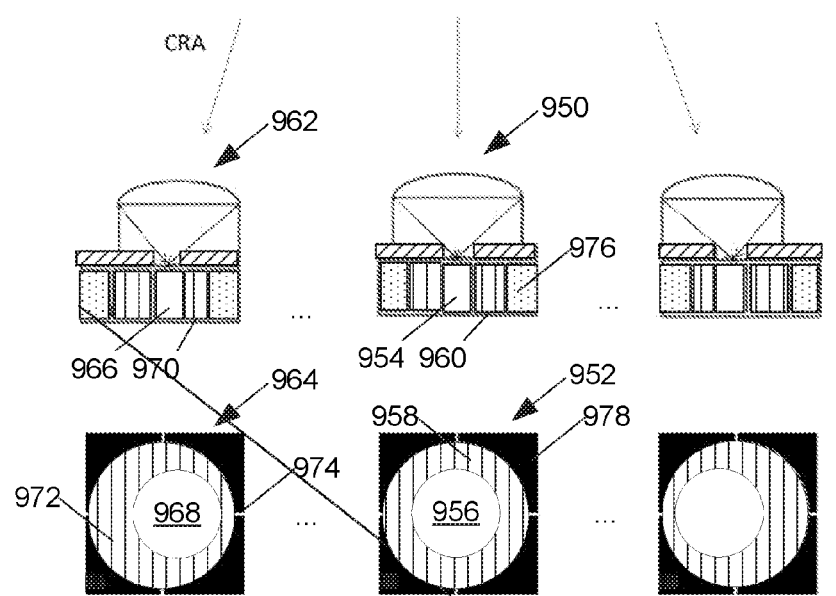
FIG. 11
FIG. 12

US 9,331,118 B2

SENSOR AND METHOD FOR COLOR PHOTOSENSOR ARRAY WITH SHIELDED, DEEP-PENETRATION, PHOTODIODES FOR COLOR DETECTION

BACKGROUND

There is a huge market for color photosensors, particularly for use in electronic cameras. In 2013, the market is dominated by cameras having a single photosensor array integrated circuit. Each photosensor of the array typically has a photodiode sensor, together with ancillary circuitry for precharging and reading the photodiodes. The majority of photosensor arrays used in cameras use three patterned color filter layers in a repeated, or tiled, pattern over individual photosensors of the array such that the array has a pattern of photosensors sensitive to at least three colors of incident light, as illustrated in FIG. 1, illustrating a red 102, blue 104, and green 106—sensitive photo sensor with a red 108 filter over the red sensor, a blue filter 110 over the blue sensor, and a green filter 112 over the green sensor. Typically, the photodiodes have a second contact in substrate 114. Many of these photosensor arrays, known as Bayer-pattern sensors, have the photosensors organized in rectangular patterns on the array.

Many such photosensor arrays include an array of microlenses 116, with an individual microlens over the filter of each photosensor of the array. In order to prevent interference by stray light interacting with ancillary circuitry of the array, there may be an opaque mask 118 over portions of the silicon surface 120 between photodiodes and over ancillary circuitry. For simplicity, ancillary circuitry of each pixel and of the array are not shown in FIG. 1.

SUMMARY

In an embodiment, a photosensor has a masking layer having an opening over a central photodiode; a first adjacent photodiode, the first adjacent photodiode covered by the masking layer and located sufficiently near the central photodiode that at least some light admitted through the opening over the central photodiode is capable of reaching the first adjacent photodiode through the central photodiode. The photosensor also has a second adjacent photodiode; the second adjacent photodiode covered by the masking layer and located sufficiently near the first adjacent photodiode that at least some light admitted through the opening over the central photodiode is capable of reaching the second adjacent photodiode through the first adjacent photodiode; and ancillary circuitry for resetting and reading charge on the photodiodes.

In another embodiment, a method of generating a blue, a green, and a red channel signal includes admitting light through an opening in an opaque mask into a central photodiode, the opaque mask preventing direct admission of light into a first adjacent and a second adjacent photodiode; allowing a portion of light not absorbed in the central photodiode into the first adjacent photodiode; allowing a portion of light not absorbed in the first adjacent photodiode into the second adjacent photodiode; reading signals corresponding to light absorption in the central, first adjacent, and second adjacent photodiodes; and processing the signals to produce the red, green, and blue signals.

BRIEF DESCRIPTION OF THE FIGURES

FIG. 9 is cross-sectional illustration of an alternative embodiment having reflective layers that propagate light from a center photodiode through adjacent and second adjacent photodiodes.

FIG. 11 is a cross-sectional illustration of compensation for non-perpendicular chief ray angle by offsetting the central photodiode of each non-central photosensor.

FIG. 12 is top plan view illustration of compensation for chief ray angle by offsetting the central photodiode of each non-central photosensor.

DETAILED DESCRIPTION OF THE EMBODIMENTS

Figure 1:
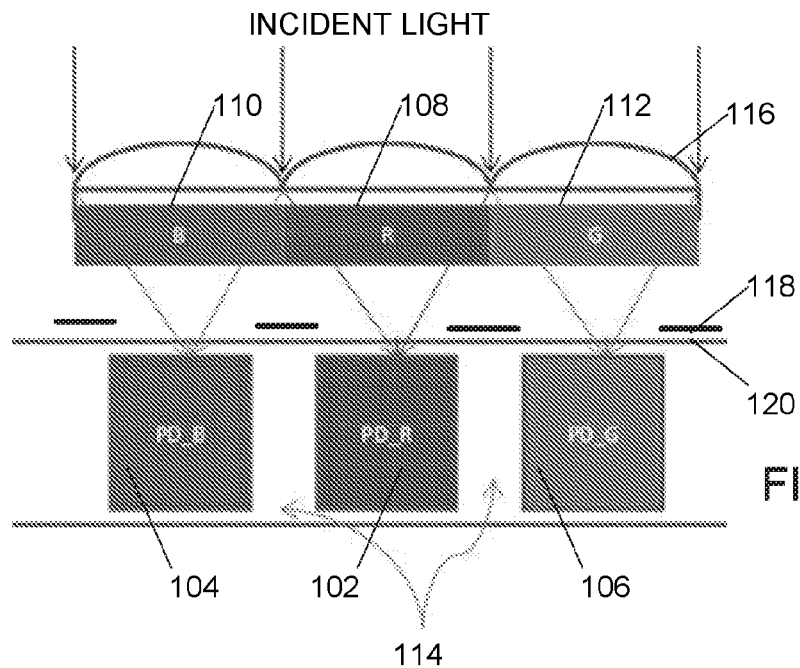
FIG. 1 is a schematic cross-section illustration of a portion of a PRIOR ART Bayer-style color photosensor array.
Figure 2:
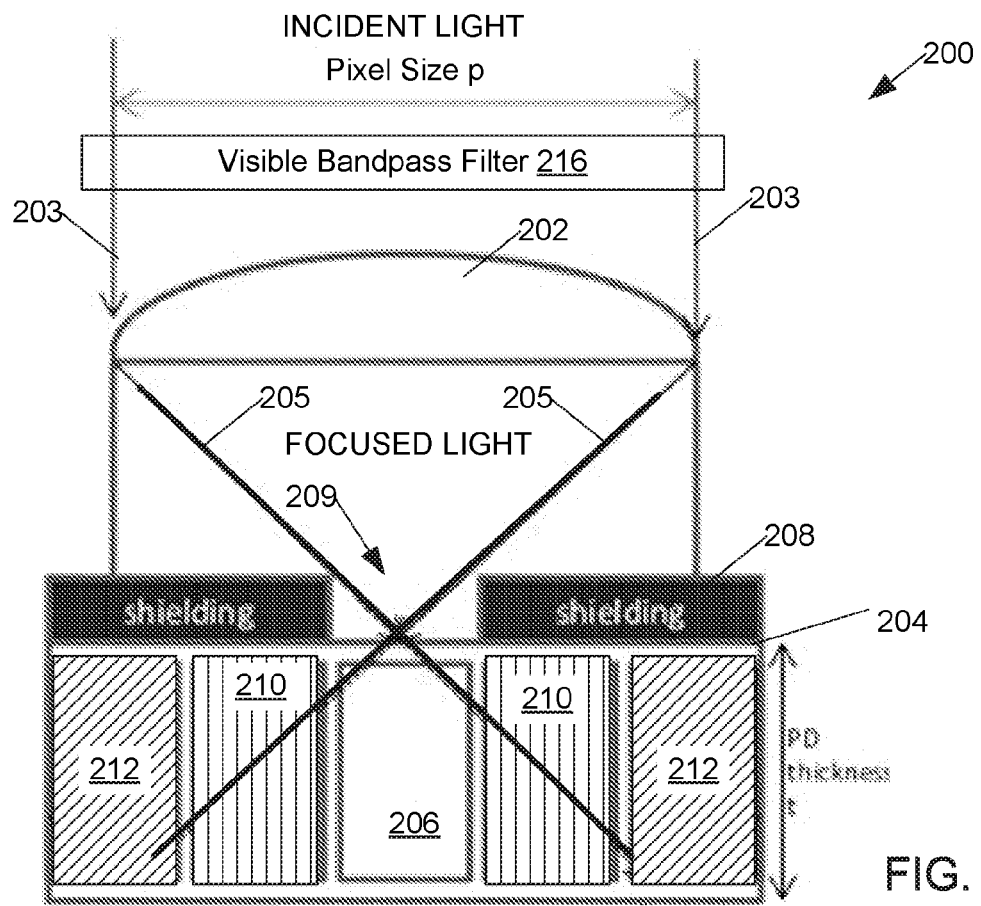
FIG. 2 is a schematic cross-section illustration of a photosensor according to an embodiment.

A new photosensor 200 is illustrated in schematic cross-section in FIG. 2. This photosensor has a microlens 202 of diameter pixel size p 207 that focuses incident light into focused light that passes through an opening 209 in a reflective or opaque mask 208 to strike the silicon surface 204 and enters a central photodiode 206 of the photosensor, or pixel sensor. Arrows 203 and lines 205 represent an exemplary path of incident light rays received by photosensor 200 at periphery of microlens 202. Central photodiode 206 is flanked by at least a first adjacent photodiode 210, and a second adjacent photodiode 212. First adjacent photodiode 210 and second adjacent photodiode 212 are covered by opaque mask 208. The opening 209 is positioned such that focused light reaching first and second adjacent photodiodes 210, 212 must pass through both opening 209 and at least a portion of central pixel photodiode 206. Further, the photodiodes and opening 209 are arranged such that light reaching second adjacent photodiode 212 from opening 209 must pass through at least a portion of first adjacent photodiode 210, and light reaching first adjacent photodiode 210 must pass through opening 209 and at least a portion of central photodiode 206 because mask 208 covers both first 210 and second 212 adjacent photodiodes.

Figure 3:
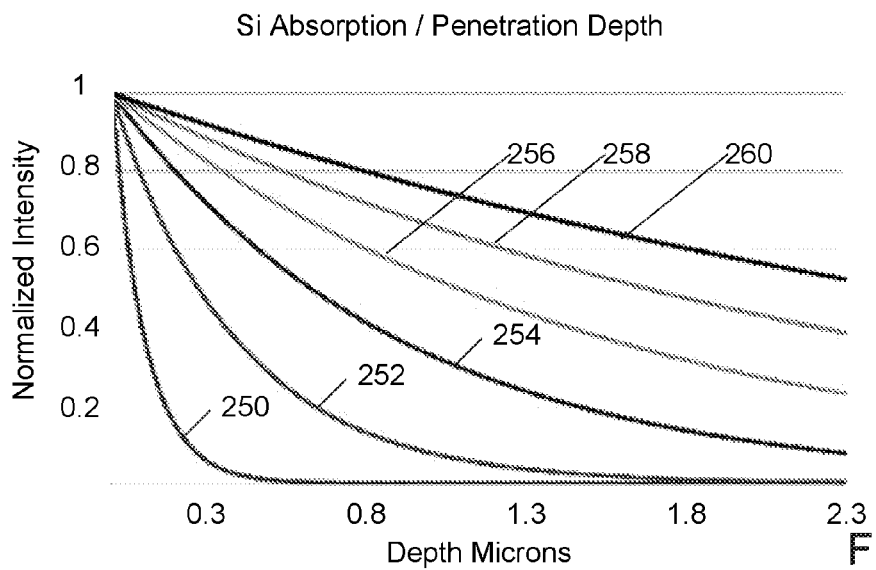
FIG. 3 is a penetration depth versus wavelength chart, illustrating that short wavelength photons are absorbed nearer the surface of silicon than are long wavelength photons.

It is known, as illustrated in FIG. 3, that photons of shorter wavelengths of light are absorbed nearer the light-exposed surface of silicon than longer wavelengths. For example, light of short 400 nanometer wavelength 250 is mostly absorbed within three tenths of a micron of the silicon surface, while light of much longer 650 nanometer wavelength 260 may still have half strength at 2.3 microns after entering the surface, with light of intermediate wavelengths, such as 450 nanometer 252, 500 nanometer 254, 550 nanometer 256, 600 nanometer 258 wavelength light, being mostly absorbed at intermediate depths.

Figure 4:
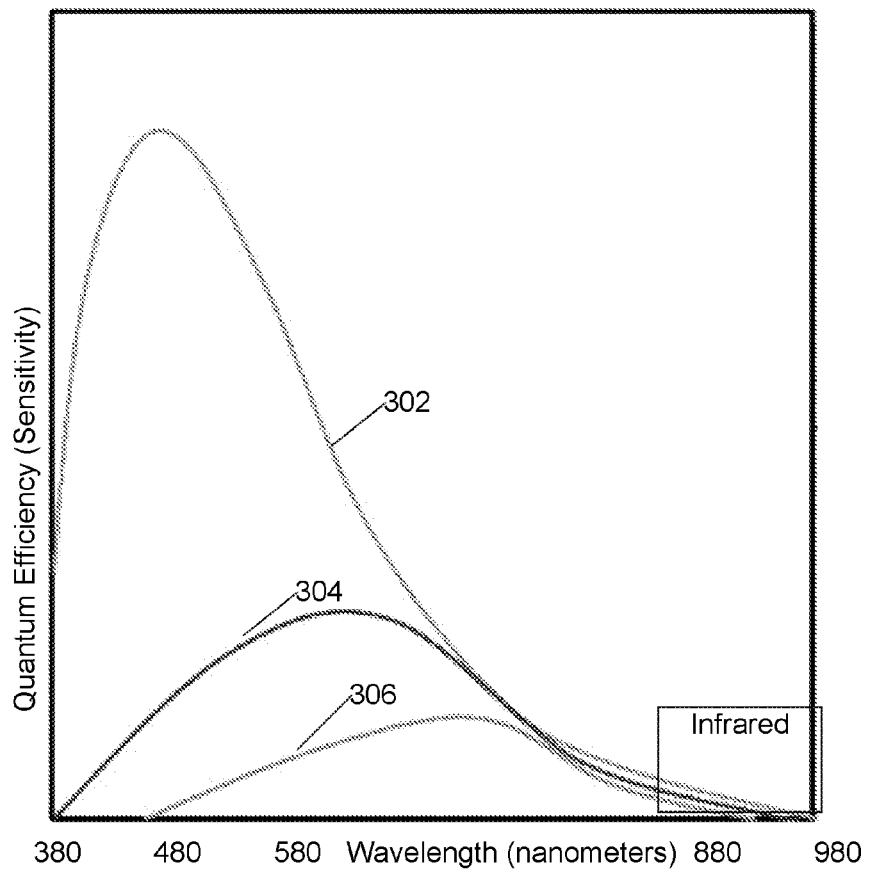
FIG. 4 is a chart illustrating quantum efficiency versus wavelength for a particular arrangement of central, and first and second adjacent photodiodes.

Based on the greater penetration of long wavelength light into silicon than short wavelength light illustrated in FIG. 3, and assuming that the central 206 and first adjacent 210 photodiodes are appropriately sized, such that significant long wavelength light but little short-wavelength light reaches the second adjacent photodiode 212, a color photosensor as illustrated in FIG. 2 has quantum efficiencies as illustrated in FIG. 4. Central photodiode 206 has a quantum efficiency 302 peaking in the blue, first adjacent photodiode 210 a quantum efficiency 304 peaking in the green, and second adjacent photodiode 212 a quantum efficiency 306 peaking in the red. Sensitivity of all three photodiodes in the infrared and ultraviolet in some embodiments is eliminated by placing a visible-light bandpass filter 216 over the photosensor.

Figure 5:
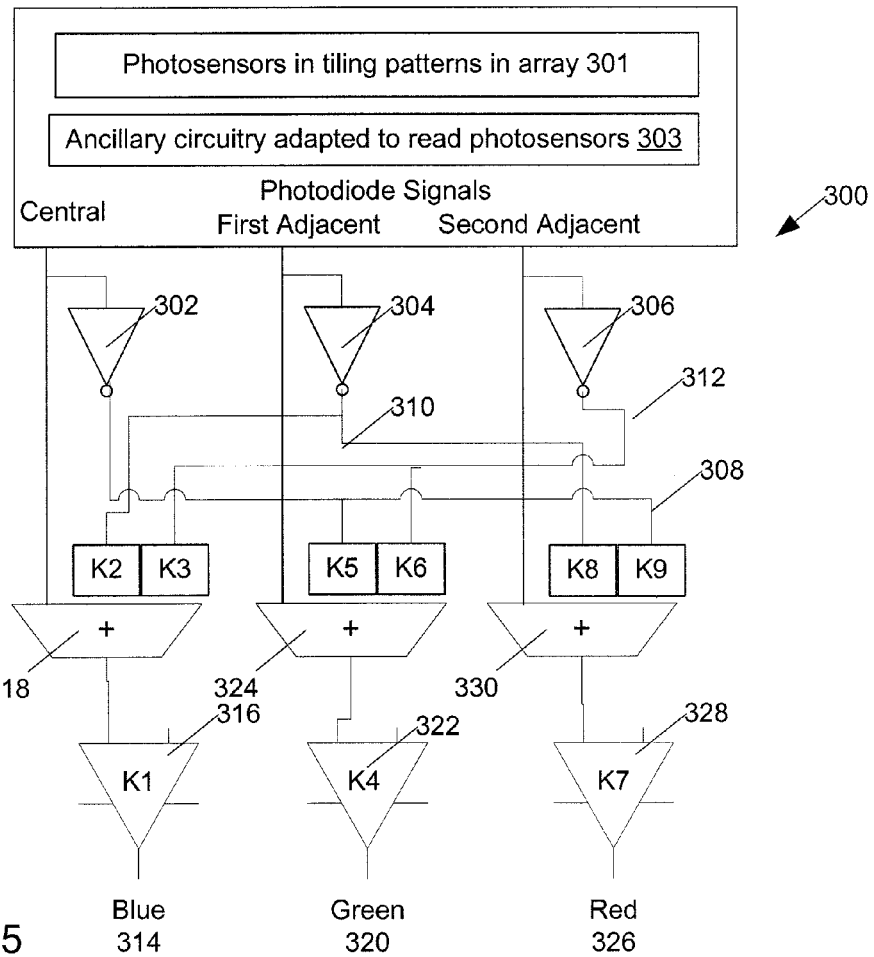
FIG. 5 illustrates circuitry useful for deriving conventional red, green, and blue channel signals from signals provided by the photosensor of FIG. 2 or 6.

The photosensors illustrated in FIG. 2 are sequentially read by ancillary circuitry to produce three raw signals, a first center signal corresponding to photons received by the central photodiode 206, a second first-adjacent signal corresponding to photons received by the first adjacent photodiode 210, and a second adjacent signal corresponding to photons received by the second adjacent photodiode 212. The photosensor of FIG. 2 does not directly provide a conventional red, green, and blue channel signal because the central photodiode does respond somewhat to longer wavelengths of light. The signals they do produce can, however, be cleaned up by processing them in either analog or digital circuitry, as indicated in FIG. 5, and according to the equations:

Blue Output=$K1$*(central signal–$K2$*first adjacent signal–$K3$*second adjacent signal)

Green Output=$K4$*(first adjacent signal–$K5$*central signal–$K6$*second adjacent signal)

Red Output=$K7$*(second adjacent signal–$K8$*first adjacent signal–$K9$*central signal)

Figure 6:
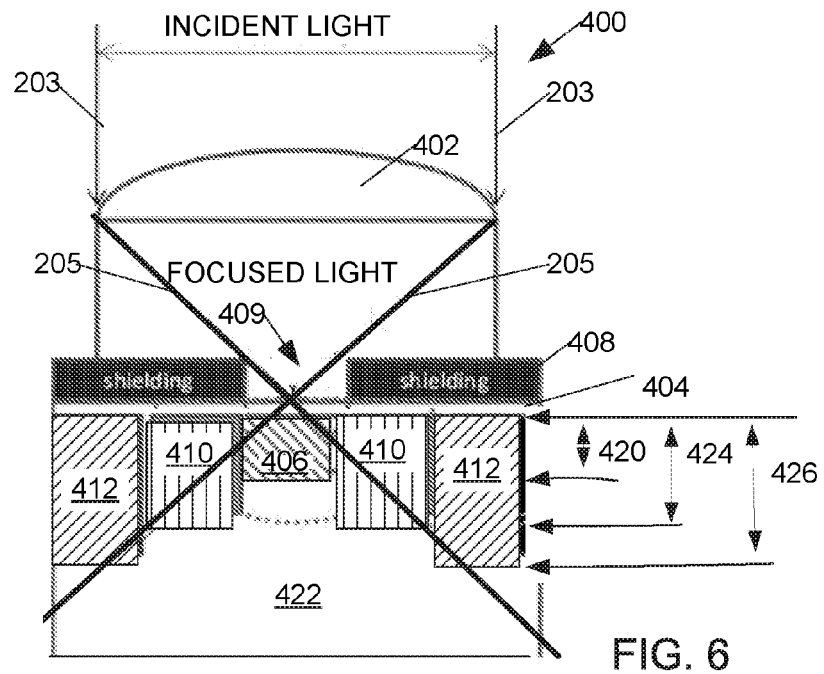
FIG. 6 illustrates an alternative embodiment of cross section of the photosensor

In an embodiment (FIG. 5) of a photosensor array utilizing many photosensors as illustrated in FIG. 2 or 6 organized in tiling patterns in an array, the photodiodes of the photosensors 301 are precharged and read by ancillary circuitry 303 to produce raw central, first adjacent, and second adjacent signals. The signals, including the central, first adjacent, and second adjacent signals are inverted by central 302, first adjacent 304, and second adjacent 306 inverting amplifiers to provide minus central 308, minus first adjacent 310, and minus second adjacent 312 signals. A blue output 314 is provided by an amplifier 316 that amplifies by a constant K1 the output of a scaling adder 318. Scaling adder 318 adds the central signal to a constant K2 times the minus first adjacent and constant K3 times the minus second adjacent signal. Similarly, a green output 320 is provided by an amplifier 322 that amplifies by a constant K4 the output of a scaling adder 324. Scaling adder 324 adds the first adjacent signal to a constant K5 times the minus central signal and constant K6 times the minus second adjacent signal. Similarly, a red output 326 is provided by an amplifier 328 that amplifies by a constant K7 the output of a scaling adder 330. Scaling adder 330 adds the second adjacent signal to a constant K9 times the minus central signal and minus constant K8 times the first adjacent signal. The constants K1-K9 depend on the desired degree of color saturation and the exact dimensions and spacings of the photodiodes and can be determined by experiment. Since little blue light reaches second adjacent photodiodes, in some embodiments input K9 is omitted from scaling adder 330.

An alternative embodiment of the new photosensor 400 is illustrated in schematic cross-section in FIG. 6. This photosensor has a microlens 402 that focuses incident light into focused light that passes through an opening 409 in an opaque mask 408 to strike the silicon surface 404 and enters a central pixel photodiode 406. Photodiode 406 is flanked by at least a first adjacent photodiode 410, and a second adjacent photodiode 412. The opening 409 positioned such that focused light reaching first and second adjacent photodiodes 410, 412 must pass through both opening 409 and at least a portion of central pixel photodiode 406. Further, the photodiodes and opening 409 are arranged such that light reaching second adjacent photodiode 412 from opening 409 must pass through at least a portion of first adjacent photodiode 410, and light reaching first adjacent photodiode 410 must pass through opening 409 and at least a portion of central photodiode 406 because mask 408 covers both first 410 and second 412 adjacent photodiode. The embodiment of FIG. 6 differs from that of FIG. 2 in that the central photodiode is diffused to a first depth 420 in substrate 422, the first adjacent photodiode is diffused to a second depth 424 in substrate 422, and the second adjacent photodiode is diffused to a third depth 426, where the first, second, and third depth are unequal, with the third depth greater than the first depth. The embodiment of FIG. 2 presumes equal depth of the photodiodes. The embodiment of FIG. 6 may provide improved quantum efficiency for the middle and longer wavelengths that reach the first 410 and second 412 adjacent photodiodes.

A photosensor array having photosensors with cross section illustrated in FIG. 2 or 6 may have a central photodiode with a first adjacent photodiode drawn as an annular ring around it, and a second adjacent photodiode drawn as a second annular ring around the first adjacent photodiode. An array of photosensors of this type may have equal resolution in all color channels.

Figure 7:
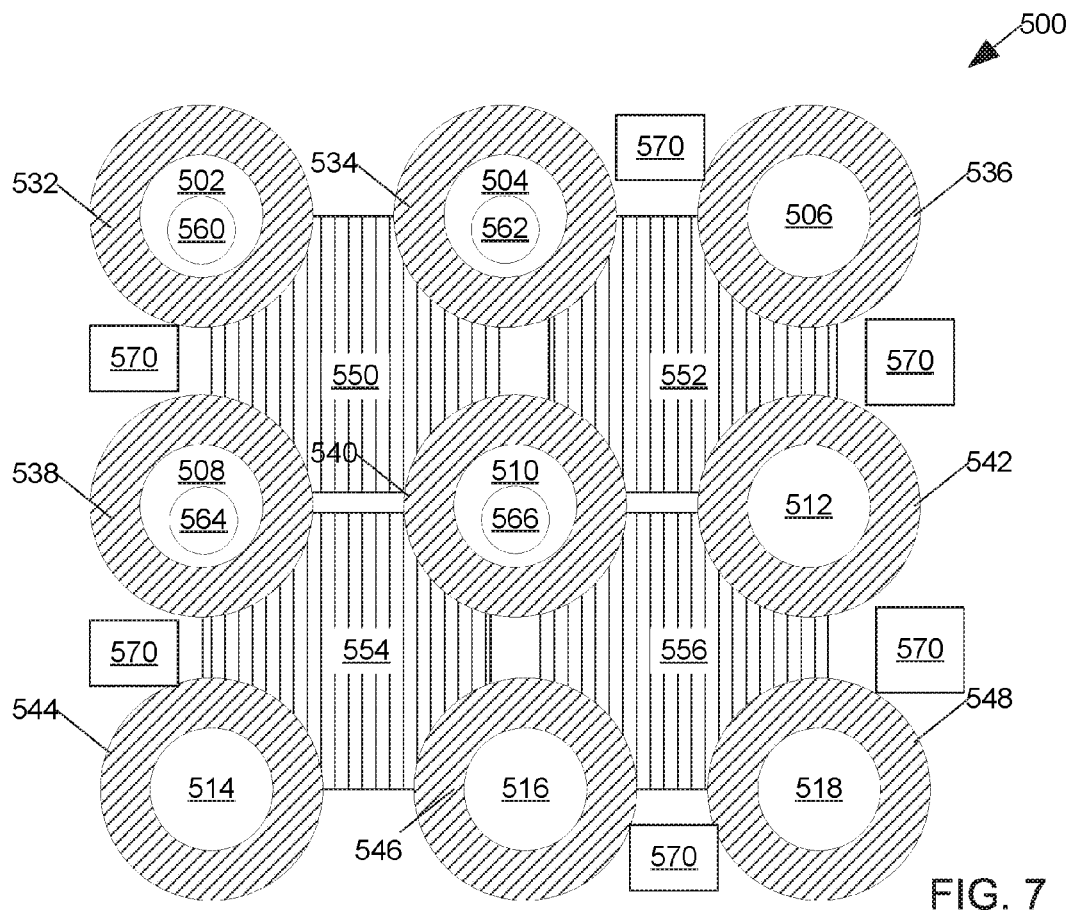
FIG. 7 is a top plan view of a photosensor having cross section of FIG. 2 or FIG. 6.

A top plan view of a tiling-pattern unit 500 of a photosensor array having a photosensor having cross section illustrated in FIG. 2 or FIG. 6 and shared second adjacent photodiodes is illustrated in FIG. 7. The tiling-pattern unit of FIG. 7 takes advantage of the fact that most photosensor arrays as marketed today provide higher resolution in intensity than in color, and in particular in the red channel. In this embodiment, a first 502, second 504, third 506, fourth 508, fifth 510, sixth 512, seventh 514, eighth 516, and ninth 518 central photodiodes are provided, corresponding to nine central photodiodes of nine color photosensors illustrated in FIG. 2 or 6. Surrounding each central photodiode is a first-adjacent photodiode, such as first 532, second 534, third 536, fourth 538, fifth 540, sixth 542, seventh 544, eighth 546, and ninth 548 first-adjacent photodiode. Interspersed between the first-adjacent photodiodes are shared second-adjacent photodiodes 550, 552, 554, 556; second adjacent photodiode 550 receives light that has passed through an opening 560 in an opaque mask layer over photodiode 502, through part of photodiode 502 and through first adjacent photodiode 522. Second adjacent photodiode 550 also receives light that has passed through an opening 562 in the opaque mask layer over photodiode 504, through part of photodiode 504 and through first adjacent photodiode 524. Cross-shaped second adjacent photodiode 550 also receives light that has passed through an opening 564 in the opaque mask layer over photodiode 508, through part of photodiode 508 and through first adjacent photodiode 538, and light that has passed through an opening 566 in the opaque mask layer over photodiode 510, through part of photodiode 510 and through first adjacent photodiode 540. Similarly, second-adjacent photodiode 552 receives light that has passed through second-adjacent photodiodes and entered through central photodiodes 504, 506, 510, and 512. Each tiling pattern is also provided with a portion of ancillary circuitry 570 sufficient to reset each photodiode by applying a predetermined charge or reset voltage to the photodiode, and, after each exposure, to sense remaining charge on each photodiode as known in the art of photosensor arrays. In a typical embodiment, ancillary circuitry 570 includes coupling transistors capable of coupling charge on, or a signal dependent on charge on, photodiodes to column sense lines under control of row lines.

Applicant notes that the round central photodiodes and ring-shaped first-adjacent and cross-shaped second-adjacent photodiodes of the pattern of FIG. 7 need not be round, or complete rings or crosses, and are typically separated by a diffusion-spacing from each other. In some embodiments, gaps in the rings or crosses are used for ancillary circuitry, not shown.

Figure 8:
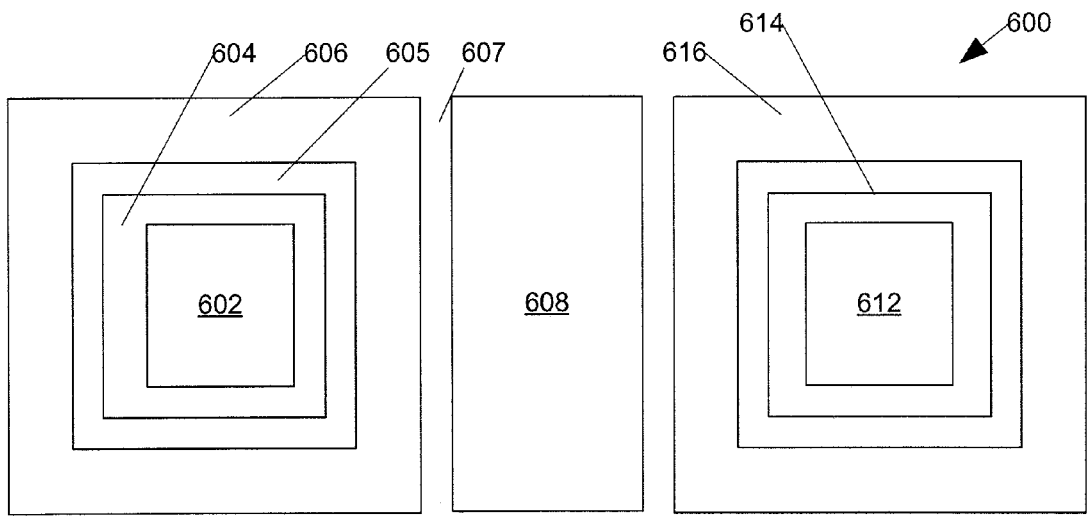
FIG. 8 is a top plan view of an alternative embodiment of a photosensor having cross section of FIG. 2 or FIG. 6.

An alternative embodiment of a two-photosensor tiling unit 600 (FIG. 8), suitable for processes that favor rectangular shapes and rectangular arrays, has a rectangular opening 602 in the masking layer that admits light directly to a first central photodiode 604. First central photodiode 604 is surrounded by first adjacent photodiode 606, and a second adjacent photodiode 608 is adjacent the first adjacent photodiode. An isolation space 605 separates the central and first adjacent photodiodes, and isolation space 607 separates the first adjacent and second adjacent photodiodes. Light can also enter through a second opening 612 in the masking layer that admits light directly to a second central photodiode 614. Light not absorbed in second central photodiode 614 may penetrate to and be absorbed in second first-adjacent photodiode 616, and light not absorbed in either second central photodiode 614 or second first-adjacent photodiode 616 may reach and be absorbed in shared second-adjacent photodiode 608.

In yet another embodiment 700 (FIG. 9), microlens 702 focuses light 707 through opening 704 in absorptive shielding 705 into central photodiode 706. Some light, in particular shorter wavelength light, is absorbed in central photodiode 706. Some remaining light transiting through photodiode 706 reaches first adjacent photodiode 708 directly, additional light 709 transiting through photodiode 706 reaches a reflective layer 710 and is reflected into first adjacent photodiode 708. Some light, in particular light of middle wavelengths, is absorbed in first adjacent photodiode 708, while some remaining light transits through photodiode 708 directly into second adjacent photodiode 712, while some remaining light 711 reaches reflective layer 714 (having an opening aligned with opening 704) and is reflected into second adjacent photodiode 712. Openings in reflective layers 714, 710 allow unabsorbed photons to escape into shielding 705 or out the back of the photosensor.

Figure 10:
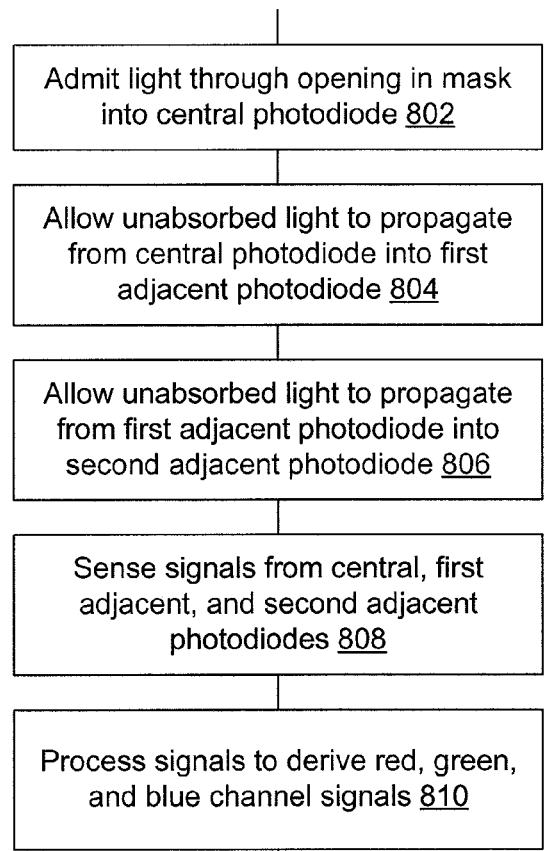
FIG. 10 is a flowchart of a method of sensing light.

As described above, the photosensor and ancillary circuitry of the array operates by admitting light 802 (FIG. 10, with reference to FIG. 2) through an opening 209 in an opaque mask 208 into a central photodiode 206, the opaque mask preventing direct admission of light into a first adjacent 210 and a second adjacent 212 photodiode. A portion of light not absorbed in the central photodiode is allowed to pass 804 into the first adjacent photodiode 210. A portion of light not absorbed in the first adjacent photodiode 210 is also allowed 806 to pass into the second adjacent photodiode 212. Signals are sensed 808 corresponding to light absorption in the central 206, first adjacent 210, and second adjacent 212 photodiodes; and the signals are processed, by circuitry similar to that of FIG. 5, to produce the red, green, and blue signals.

Figure 11A:
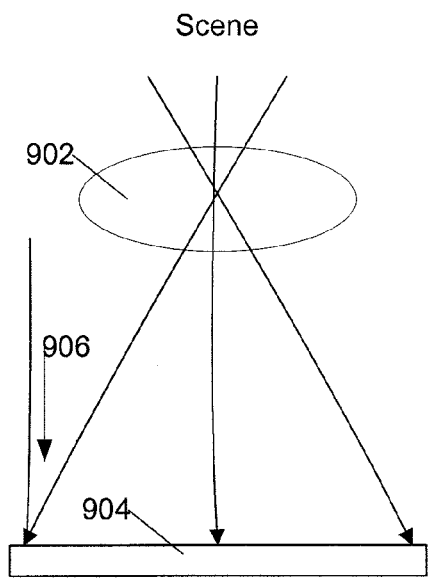
FIG. 11A is a schematic illustration of chief ray angle (CRA).

Photosensor array circuits, and associated microlenses 202 (FIG. 2), are typically planar, with the silicon surface 204 approximately in the same plane for all photosensors throughout the circuit, and with all microlenses intersecting a common plane. When these sensors are used in a camera, as illustrated in FIG. 11A, light passing from a scene through a center of a main camera lens 902 will arrive perpendicular to the microlens plane at the center of the photosensor array 904, while light arriving near an edge of the photosensor array will arrive at a non-perpendicular chief-ray-angle (CRA) 906.

In an embodiment, in order to compensate for the CRA, as illustrated in FIGS. 11 and 12 a photosensor 950, 952 in the center of the array having perpendicular CRA has its central photodiode 954, 956, along with its opening in opaque mask, centered in first-adjacent photodiode 958, 960, while a photosensor 962, 964 located nearer to an array edge has its central photodiode 966, 968, along with its opening in opaque mask, offset, or located off-center, in first-adjacent photodiode 970, 972, and in particular located closer to, or offset towards, an array-centric side 974 of the first-adjacent photodiode 970, 972. As with other embodiments, first-adjacent photodiode 970, 972 is surrounded by one or more second-adjacent photodiodes 976, 978.

It should be noted that the matter contained in the above description or shown in the accompanying drawings should be interpreted as illustrative and not in a limiting sense. The following claims are intended to cover generic and specific features described herein, as well as all statements of the scope of the present method and system.

What is claimed is:

1. A color photosensor comprising:
   an opaque masking layer having an opening over a central photodiode;
   a first adjacent photodiode, the first adjacent photodiode covered by the masking layer and located sufficiently near the central photodiode that at least some light admitted through the opening over the central photodiode is capable of reaching the first adjacent photodiode;
   a second adjacent photodiode, the second adjacent photodiode covered by the masking layer and located adjacent to and sufficiently near the first adjacent photodiode least at least a portion of the first adjacent photodiode is disposed between the second adjacent photodiode and the central photodiode, the second adjacent photodiode neither being uncovered by the masking layer nor being adjacent to a photodiode uncovered by the masking layer and configured such that a majority of photons admitted through the opening over the central photodiode and reaching the second adjacent photodiode pass through a first adjacent photodiode before reaching the second adjacent photodiode, the first adjacent photodiode serving as a color filter for the second adjacent photodiode; and
   ancillary circuitry configured for resetting and reading charge on the photodiodes.

2. A photosensor array comprising an array of photosensors of claim 1, the photosensors organized in a tiling pattern of at least two photosensors.

3. A photosensor array circuit comprising the array of claim 2 and further comprising ancillary circuitry for reading photodiodes of the array.

4. The photosensor array circuit of claim 3 further comprising circuitry adapted to produce a blue signal from a central photodiode signal by subtracting a signal derived from second adjacent photodiode signals and by subtracting a signal derived from first adjacent photodiode signals.

5. The photodiode array circuit of claim 4 further comprising circuitry adapted to produce a green signal from the first adjacent photodiode signal by subtracting a signal derived from second adjacent photodiode signals.

6. The photodiode array circuit of claim 4 wherein at least one photosensor located near a center of the array has its central photodiode centered in its first-adjacent photodiode and at least a second photosensor located near an edge of the array has its central photodiode offset in its first adjacent photodiode.

7. The photodiode array circuit of claim 6 wherein the central photodiode of the second photosensor is offset towards a center of the array.

8. The photosensor array circuit of claim 3 wherein the tiling pattern has a shared second adjacent photodiodes adjacent to at least two first-adjacent photodiodes.

9. The photosensor array circuit of claim 8 further comprising circuitry adapted to produce a blue signal from a central photodiode signal by subtracting a signal derived from second adjacent photodiode signals and by subtracting a signal derived from first adjacent photodiode signals.

10. The photodiode array circuit of claim 9 further comprising circuitry adapted to produce a green signal from an adjacent photodiode signal by subtracting a signal derived from second adjacent photodiode signals.

11. The photodiode array circuit of claim 3 wherein at least one photosensor located near a center of the array has its central photodiode centered in its first-adjacent photodiode and at least a second photosensor located near an edge of the array has its central photodiode offset in its first adjacent photodiode.

12. A method of generating a blue, a green, and a red channel signal for a pixel comprising:
    admitting light through an opening in an opaque mask into a central photodiode, the opaque mask preventing direct admission of light into a first adjacent and a second adjacent photodiode, the central photodiode configured to serve as a first color filter for light reaching the first adjacent photodiode, the first adjacent photodiode configured to serve as a second color filter for light reaching the second adjacent photodiode with at least a portion of the first adjacent photodiode being disposed between the central photodiode and the second adjacent photodiode;
    allowing a portion of light not absorbed in the central photodiode into the first adjacent photodiode;
    allowing a portion of light that has passed through the first adjacent photodiode but was not absorbed in the first adjacent photodiode into the second adjacent photodiode;
    reading signals corresponding to light absorption in the central, first adjacent, and second adjacent photodiodes; and
    producing the red, green, and blue signals primarily by processing the signals from the central, first adjacent, and second adjacent photodiodes, the processing comprising subtracting scaled first and second adjacent photodiode signals from the central photodiode signal to provide a blue signal, and subtracting a scaled second adjacent photodiode signal from the first adjacent photodiode signal to provide a green signal, where the red, green, and blue signals are separate signals.

13. The method of claim 12 wherein the blue signal is obtained by a method comprising scaling and differencing the first, second, and third photodiode signals.

14. The method of claim 13 wherein the green signal is obtained by a method comprising scaling and differencing the first adjacent photodiode signal, and the second adjacent signal.

15. A tiling pattern of photosensors on a photosensor array circuit comprising:
    an opaque masking layer having an opening over a plurality of central photodiodes;
    a plurality of first adjacent photodiodes, each first adjacent photodiode covered by the masking layer and located sufficiently near at least one central photodiode that at least some light admitted through the opening over the central photodiode is capable of reaching the first adjacent photodiode
    a plurality of second-adjacent photodiodes, each second adjacent photodiode covered by the masking layer and located adjacent to and sufficiently near at least one first adjacent photodiode and configured such that light admitted through the opening over at least one central photodiode is reaches the second adjacent photodiode after passing through and being filtered by the central photodiode and at least one first adjacent photodiode, and light reaching the first adjacent photodiode is filtered by the central photodiode; at least a portion of the first adjacent photodiode being disposed between the central photodiode and the second adjacent photodiode, the second adjacent photodiode neither being a central photodiode nor adjacent to a central photodiode;
    ancillary circuitry configured for resetting and reading charge on the photodiodes.

16. A photosensor array circuit comprising a plurality of the tiling patterns of claim 15 and further comprising circuitry adapted to produce a blue signal from a central photodiode signal by subtracting a signal derived from second adjacent photodiode signals and by subtracting a signal derived from first adjacent photodiode signals.

17. The photodiode array circuit of claim 16 wherein at least one tiling pattern located near a center of the array has a central photodiode centered in a first-adjacent photodiode and at least a second photosensor located near an edge of the array has a corresponding central photodiode offset in its corresponding first adjacent photodiode towards a center of the array.

* * * * *